United States Patent
Sato

(10) Patent No.: US 8,618,585 B2
(45) Date of Patent: Dec. 31, 2013

(54) SEMICONDUCTOR APPARATUS INCLUDING COOLING BASE WITH PROJECTIONS

(75) Inventor: Kenichiro Sato, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 32 days.

(21) Appl. No.: 13/188,918

(22) Filed: Jul. 22, 2011

(65) Prior Publication Data

US 2012/0018741 A1 Jan. 26, 2012

(30) Foreign Application Priority Data

Jul. 23, 2010 (JP) ................................ 2010-165759
Mar. 10, 2011 (JP) ................................ 2011-053332

(51) Int. Cl.
*H01L 29/15* (2006.01)
*H01L 29/06* (2006.01)
*H01L 23/34* (2006.01)

(52) U.S. Cl.
USPC ........... 257/276; 257/625; 257/706; 257/717; 257/720; 257/E29.082; 257/E23.101; 257/E23.103; 257/E23.105

(58) Field of Classification Search
USPC ................... 257/77, 625, 706, 717, 720, 796, 257/E29.082, E23.101, E23.103, E23.105
See application file for complete search history.

(56) References Cited

U.S. PATENT DOCUMENTS

| 5,365,400 A | * | 11/1994 | Ashiwake et al. ............ 361/752 |
| 2007/0057284 A1 | * | 3/2007 | Casey et al. ................... 257/177 |
| 2010/0172091 A1 | * | 7/2010 | Nishiura ........................ 361/689 |
| 2011/0049535 A1 | | 3/2011 | Soeno |
| 2011/0062491 A1 | * | 3/2011 | Nakata .......................... 257/146 |

FOREIGN PATENT DOCUMENTS

| JP | 2001-245479 A | 9/2001 |
| JP | 2005-005593 A | 1/2005 |
| JP | 2009-272482 A | 11/2009 |

* cited by examiner

*Primary Examiner* — Wensing Kuo
*Assistant Examiner* — Moazzam Hossain
(74) *Attorney, Agent, or Firm* — Rossi, Kimms & McDowell LLP

(57) ABSTRACT

A semiconductor apparatus according to embodiments of the invention can include a first semiconductor device made of silicon, the first semiconductor devices being arranged collectively, whereby to form a first device group, and a second semiconductor device made of silicon carbide, the second semiconductor devices being arranged collectively, whereby to form a second device group. The apparatus can also include a wiring conductor connecting the first semiconductor device and the second semiconductor device, a cooling fin base comprising a projection formed thereon, whereby to dissipate heat generated from the first and second semiconductor devices, and the projections arranged under the second device group being spaced apart from each other more widely than the projections arranged under the first device group.

12 Claims, 18 Drawing Sheets

FIG. 17 (a)
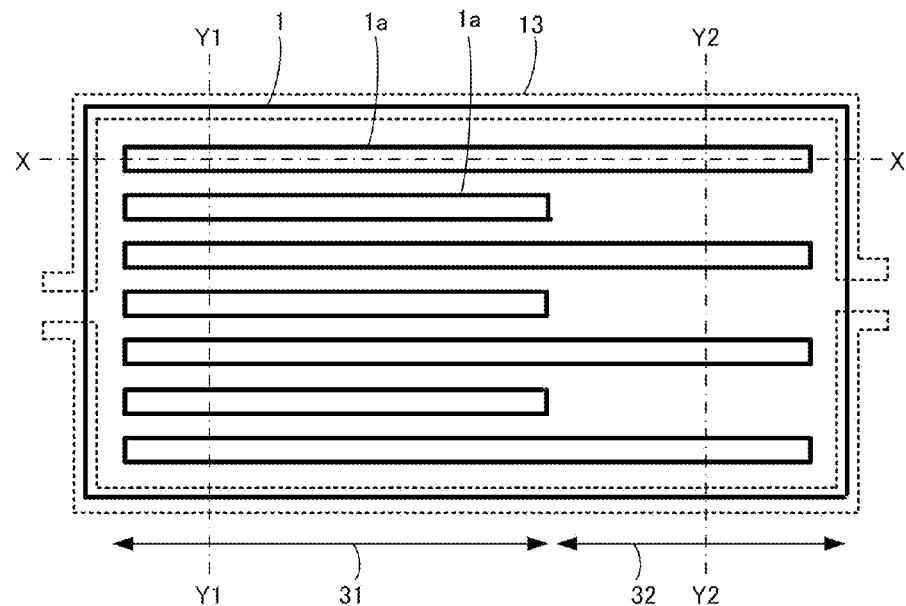
FIG. 17 (b)
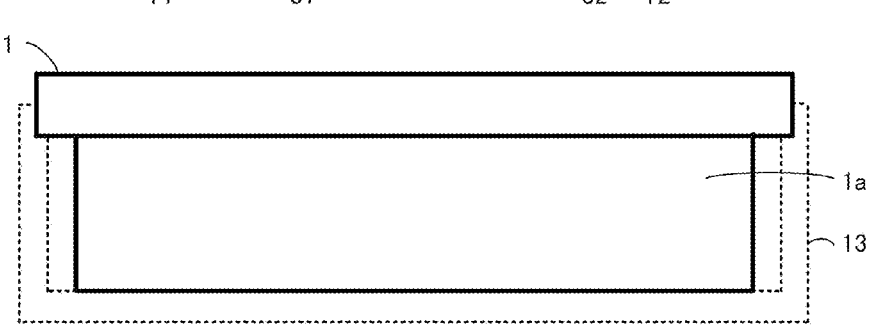
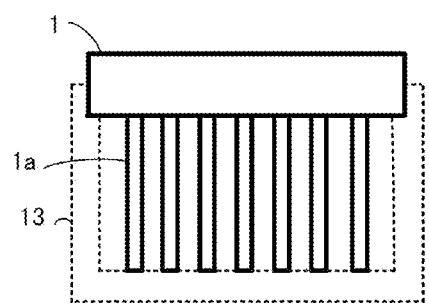
FIG. 17 (c)
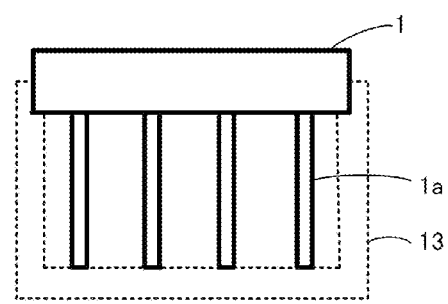
FIG. 17 (d)

SEMICONDUCTOR APPARATUS INCLUDING COOLING BASE WITH PROJECTIONS

FIELD OF THE INVENTION

Embodiments of the present invention relate to semiconductor apparatuses mounting an electric circuit such as an inverter circuit thereon and including a Si ("Silicon") semiconductor device and a SiC ("Silicon Carbide") semiconductor device.

BACKGROUND

FIG. 10 is a circuit diagram of a three-phase inverter. The three-phase inverter circuit shown in FIG. 10 includes an upper arm; a lower arm; a U-terminal, a V-terminal, and a W-terminal connected to the respective connection points of the upper and lower arms; a P-terminal connected to the high-potential side of the upper arm; an N-terminal connected to the low-potential side of the lower arm; semiconductor switching devices such as IGBT's constituting the upper and lower arms; and free-wheeling diodes (hereinafter referred to as "FWD's") connected in opposite parallel to the respective IGBT's.

FIG. 11(a) is the top plan view of a conventional semiconductor apparatus. FIG. 11(b) is the cross sectional view along the single-dotted chain line X-X in FIG. 11(a). FIG. 11(c) is the bottom plan view of the conventional semiconductor apparatus showing the base including fins formed thereon.

Referring now to these drawings, conventional semiconductor apparatus 600 is a power semiconductor module that constitutes the three-phase inverter circuit shown in FIG. 10 thereon.

In the following descriptions, Si-IGBT chip 54 is a silicon insulated-gate bipolar transistor chip and SiC-Di chip 55 is an FWD chip made of a silicon carbide Schottky barrier diode (SBD).

The three-phase inverter circuit includes the U-phase, V-phase and W-phase. Since the chip arrangements in these phases are the same, the chip arrangement in the U-phase is described exemplary.

In semiconductor apparatus 600, electrically conductive film 52c of insulated substrate 52 is fixed onto base 51. Insulated substrate 52 includes electrically conductive patterns 52a and 53a formed thereon. Base 51 includes fins 51a formed thereon. The collector of Si-IGBT chip 54 on the upper arm and the cathode of SiC-Di chip 55 on the upper arm are fixed onto electrically conductive pattern 52a. The collector of Si-IGBT chip 54 on the lower arm and the cathode of SiC-Di chip 55 on the lower arm are fixed onto electrically conductive pattern 53a.

The emitter of Si-IGBT chip 54 on the upper arm and the cathode of SiC-Di chip 55 on the upper arm are connected to each other with wiring bar 56. The emitter of Si-IGBT chip 54 on the lower arm and the cathode of SiC-Di chip 55 on the lower arm are connected to N-terminal bar 59. Electrically conductive pattern 52a is connected to P-terminal bar 58. The cathode of SiC-Di chip 55 on the upper arm and electrically conductive pattern 53a are connected to each other with wiring bar 57. Wiring bar 57 is connected to U-terminal bar 57a.

Since the chip arrangements in the V- and W-phases are the same with the chip arrangement in the U-phase, the duplicated descriptions on the chip arrangements in the V- and W-phases are omitted for the sake of simplicity.

U-terminal bar 57a, V-terminal bar 57b, and W-terminal bar 57c are connected to a not-shown load. P-terminal bar 58 and N-terminal bar 59 are connected to a not-shown power supply. The connection points of these terminals are exposed from a not-shown resin case.

On each of three insulated substrates 52, two Si-IGBT chips 54 and two SiC-Di chips 55 constituting the upper and lower arms are mounted and arranged in adjacent to each other. By arranging Si-IGBT chips 54 and SiC-Di chips 55 constituting the upper and lower arms collectively on the same insulated substrate 52, the heat values generated by operating Si-IGBT chips 54 and SiC-Di chips 55 on insulated substrates 52 are set to be the same.

Therefore, the generated heat values on insulated substrates 52 are equalized, fins 51a constituting base 51 are arranged with an equal spacing. Fin 51a is a plate-shaped tooth (rectangular parallelepiped). The spaces between fins 51a under insulated substrates 52 are equal. The spaces between fins 51a are set to be narrow for dissipating the heat generated by chips 54 and 55 effectively.

FIG. 12(a) is a cross sectional view describing the way of cooling semiconductor apparatus 600. FIG. 12(b) is a bottom plan view describing the way of cooling semiconductor apparatus 600.

Referring now to these drawings, cover 60 is set on base 51 including fins formed thereon. Although not illustrated, cover 60 includes an inlet for making coolant 61 flow in and an outlet for making coolant 61 flow out. Coolant 61 made to flow in from the inlet passes through the spaces between fins 51a and flows to the outlet. Coolant 61 flows through the close spaces between fins 51a. For making coolant 61 pass through the spaces between fins 51a, it is necessary to pressurize coolant 61. The pressure necessary to make coolant 61 pass through the spaces between fins 51a (the different pressure between at the inlet and at the outlet) is referred to as the "pressure loss." Usually, coolant 61 is circulated by a not-shown pump.

FIG. 13(a) is a cross sectional view describing the thermal interference caused between the chips in semiconductor apparatus 600. FIG. 13(b) is the cross sectional view along the single-dotted chain line X-X in FIG. 13(a) describing the thermal interference occurred between the chips in semiconductor apparatus 600. FIG. 13(c) is the cross sectional view along the single-dotted chain line Y-Y in FIG. 13(a) describing the thermal interference occurred between the chips in semiconductor apparatus 600.

When the three-phase inverter circuit operates, thermal interference occurs between Si-IGBT chip 54 and SiC-Di chip 55.

Now thermal interference 71 will be described below with reference to FIG. 13(b).

When Si-IGBT chip 54 on the U-phase upper arm is operating but SiC-Di chip 55 on the U-phase lower arm is not, Si-IGBT chip 54 generates heat and the heat generated is transferred from electrically conductive pattern 52a to adjacent electrically conductive pattern 53a through insulator substrate 52b. The transferred heat makes the temperature, which is low, of chip 55 fixed to electrically conductive pattern 53a rise. When SiC-Di chip 55 on the U-phase lower arm is operating but Si-IGBT chip 54 on the U-phase upper arm is not, the Si-IGBT chip 54 temperature, which is low, is raised.

Now, thermal interference 72 will be described below with reference to FIG. 13(c).

Because SiC-Di chip 55 on the U-phase upper arm is not operating, while Si-IGBT chip 54 on the U-phase upper arm is operating, Si-IGBT chip 54 generates heat and the generated heat makes the adjacent SiC-Di chip 55 temperature, which is low, rise via electrically conductive pattern 52a. When SiC-Di chip 55 on the U-phase upper arm is operating but Si-IGBT chip 54 on the U-phase upper arm is not, the Si-IGBT chip 54 temperature, which is low, is raised.

Because thermal interference 71 occurs via insulator substrate 52b and thermal interference 72 via electrically conductive pattern 52a, thermal interference 72 is larger than thermal interference 71. Thermal interference 71a caused through base 51 including fins 51a formed thereon is small, therefore the heat generated is dissipated almost to coolant 61 via fins 51a. The distances M1 and M2 between chips 54 and 56, and the distance M3 between insulated substrates 52 including an electrically conductive pattern formed thereof are several mm.

Thermal interference 72 between Si-IGBT chip 54 and SiC-Di chip 55 occurs through electrically conductive pattern 52a exhibiting a high thermal conductivity and near to the heat sources. Thermal interference 71 between Si-IGBT chip 54 and SiC-Di chip 55 occurs through insulator substrate 52b near to the heat sources and far from the coolant. Therefore, thermal interference 72 and thermal interference 71 caused in conventional semiconductor apparatus 600 are large.

FIG. 14 is a top plan view describing the heat exchanges between the chips via terminal bars in conventional semiconductor apparatus 600.

Thermal interference 65 occurs through wiring bar 56 connecting the Si-IGBT chip 54 emitter and the SiC-Di chip 55 anode on the upper arm. Thermal interference 66 occurs through N-terminal bar 59 connecting the Si-IGBT chip 54 emitter and the SiC-Di chip 55 anode on the lower arm. Thermal interference 67 occurs through wiring bar 57 connecting the Si-IGBT chip 54 anode on the upper arm and electrically conductive pattern 53a on the lower arm.

The distance between the connection point of wiring bar 56 and the Si-IGBT chip 54 emitter on the upper arm and the connection point of wiring bar 56 and the SiC-Di chip 55 anode on the upper arm is designated by N1. The distance between the connection point of N-terminal bar 59 and the Si-IGBT chip 54 emitter on the lower arm and the connection point of N-terminal bar 59 and the SiC-Di chip 55 anode on the lower arm is designated by N2. The distance between the connection point of wiring bar 57 and the Si-IGBT chip 55 anode on the upper arm and the connection point of wiring bar 57 and electrically conductive pattern 53a is designated by N3. Since the distances N1, N2, and N3 are short, from 1 cm to several cm, thermal interference 65, thermal interference 66, and thermal interference 67 are large.

The operable temperature of SiC-Di chip 55 is 250° C. However, the operable temperature of Si-IGBT chip 54 is 175° C. If SiC-Di chip 55 is operated at 250° C., the Si-IGBT chip 54 temperature will exceed 175° C. to the higher side, causing thermal destruction of Si-IGBT chip 54.

Because the operable temperature of the semiconductor apparatus is determined by the operable temperature of Si-IGBT chip 54, it is necessary to restrict the operating temperature of SiC-Di chip 55 to be 175° C. or lower.

Japanese Unexamined Patent Application Publication No. 2009-272482 (also referred to herein as "Patent Document 1"), discloses a semiconductor apparatus that includes a first laminate structure, a second laminate, and a connection section connecting the first and second laminates electrically to each other. The first laminate structure includes a first heatsink, a first isolation layer, a first electrically conductive layer, and a first semiconductor device (silicon IGBT). The second laminate structure includes a second heatsink, a second isolation layer, a second electrically conductive layer, and a second semiconductor device (SiC diode). The semiconductor apparatus separates the first and second laminate structures from each other such that the first and second laminate structures are thermally insulated from each other.

In the semiconductor apparatus disclosed in the Patent document 1, the Si-IGBT chips constituting an upper arm are aligned to form an upper arm Si-IGBT chip group. The SiC-Di chips constituting the upper arm are aligned to form an upper arm SiC-Di chip group. The Si-IGBT chips constituting a lower arm are aligned to form a lower arm Si-IGBT chip group. The SiC-Di chips constituting the lower arm are aligned to form a lower arm SiC-Di chip group. The upper arm Si-IGBT chip group and the upper arm SiC-Di chip group are arranged alternately. The lower arm Si-IGBT chip group and the lower arm SiC-Di chip group are arranged alternately. The coolant flows through the Si-IGBT chip group and, then, through the SiC-Di chip group. In other words, the semiconductor apparatus disclosed in the Patent Document 1 includes two coolant paths for cooling the chips constituting the upper arm and for cooling the chips constituting the lower arm. The coolant path is long.

Since the operable temperature of Si-IGBT chip 54 is 175° C. as described above, it is impossible to operate SiC-Di chip 55 at the operable temperature thereof, that is 250° C. Since Si-IGBT chip 54 and SiC-Di chip 55 are arranged in close proximity to each other, the thermal interference between Si-IGBT chip 54 and SiC-Di chip 55 is large. Therefore, for improving the cooling efficiency, it is necessary to set the distance between fins 51a to be short (to arrange fins 51a more closely). However, the close arrangement of fins 51a increases the pressure loss of coolant 61, further increasing the size of the pump for circulating the coolant. As a result, the manufacturing costs of the entire inverter system soar.

In the Patent Document 1, the cooling structure in which Si-IGBT chip is positioned, is the same with the cooling structure in which SiC-Di chip is positioned. Moreover, the Si-IGBT chip group and the SiC-Di chip group are arranged in adjacent to each other. Therefore, it is impossible to raise the operating temperature of the SiC-Di chip to the operable temperature thereof. Although a thermal insulation structure is formed between the Si-IGBT chip group and the SiC-Di chip group, thermal interference occurs between the Si-IGBT chip and the SiC-Di chip because of a connecting wire that is not shown.

Two coolant paths are formed in the cooling structure. Since the coolant paths are complicated and long, the coolant pressure loss is large. Therefore, the pump for circulating the coolant is large inevitably. As a result, the manufacturing costs of the entire inverter system soar.

In view of the foregoing, it would be desirable to obviate or lessen the problems described above. It would be also desirable to provide a semiconductor apparatus, including a Si semiconductor device, a SiC semiconductor device, and a base including fins formed thereon, that facilitates operating the semiconductor devices at the respective operating temperatures and reducing the pressure loss of the coolant.

SUMMARY OF THE INVENTION

According to embodiments of the invention, there is provided a semiconductor apparatus including;

a first semiconductor device made of silicon, the first semiconductor devices being arranged collectively for forming a first device group;

a second semiconductor device made of silicon carbide, the second semiconductor devices being arranged collectively for forming a second device group;

a wiring conductor connecting the first semiconductor device and the second semiconductor device;

a cooling fin base including a projection formed thereon for dissipating the heat generated from the first and second semiconductor devices; and the projections arranged under the second device group being spaced apart from each other more widely than the projections arranged under the first device group.

According to embodiments of the invention, the first semiconductor device is a MOS type transistor, and the second semiconductor device is a Schottky barrier diode.

According to embodiments of the invention, the first semiconductor device and the second semiconductor device constitute an electric circuit.

According to embodiments of the invention, the projection is nearly a rectangular parallelepiped or a cylindrical column.

According to embodiments of the invention, the wiring conductor includes a first thermal interference reduction section between the connection points of the wiring conductor and the first and second semiconductor devices.

According to embodiments of the invention, the first thermal interference reduction section is an opening or a recess.

According to embodiments of the invention, the wiring conductor is cut into two between the connection points of the wiring conductor and the first and second semiconductor devices.

According to embodiments of the invention, the cooling fin base includes a second thermal interference reduction section formed therein between the first and second device groups.

According to embodiments of the invention, the second thermal interference reduction section is a cutout or a thermal insulator stuff inserted into the portion of the cooling fin base between the first and second device groups.

According to embodiments of the invention, the semiconductor apparatus further includes a cover covering the cooling fin base for making a coolant flow between the inner wall of the cover and the projections and between the projections and for dissipating the heat from the cooling fin base to the coolant; and the cover includes a partition that makes the coolant meander.

According to embodiments of the invention, the semiconductor apparatus further includes a cover covering the cooling fin base for making a coolant flow between the inner wall of the cover and the projections and between the projections and for dissipating the heat from the cooling fin base to the coolant; and the projections include a long projection and a short projection, which are extended in parallel to the flow direction of the coolant.

According to embodiments of the invention, the projections are arranged in a planar triangular pattern.

According to embodiments of the invention, the fin arrangement under the Si semiconductor devices (chips) and the fin arrangement under the SiC semiconductor devices (chips) are made to differ to make the Si semiconductor devices operate at a temperature of 175° C. or lower and to make the SiC semiconductor devices operate at a higher temperature. As a result, the Si and SiC semiconductor devices are made to improve the performances thereof to the maximums thereof.

By widening the space between the fins under the SiC semiconductor devices, the pressure loss of the coolant is reduced.

BRIEF DESCRIPTIONS OF THE DRAWINGS

FIG. 17(a) is the bottom plan view of a modified base modified from the bases described in FIGS. 1(b) and 4(b).

FIG. 17(b) is the cross sectional view along the single-dotted chain line X-X in FIG. 17(a).

FIG. 17(c) is the cross sectional view along the single-dotted chain line Y1-Y1 in FIG. 17(a).

FIG. 17(d) is the cross sectional view along the single-dotted chain line Y2-Y2 in FIG. 17(a).

DETAILED DESCRIPTION

Now the invention will be described in detail hereinafter with reference to the accompanied drawings which illustrate the preferred embodiments of the invention.

[First Embodiment]

Figure 1A:
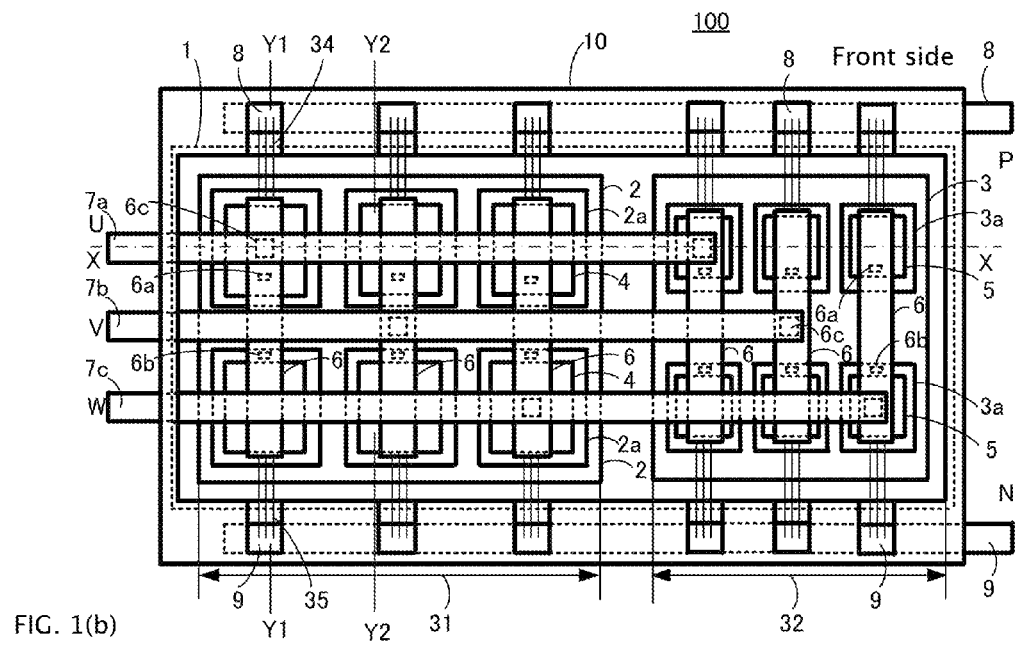
FIG. 1(a) is the top plan view of a semiconductor apparatus according to a first embodiment of the invention.
Figure 1B:
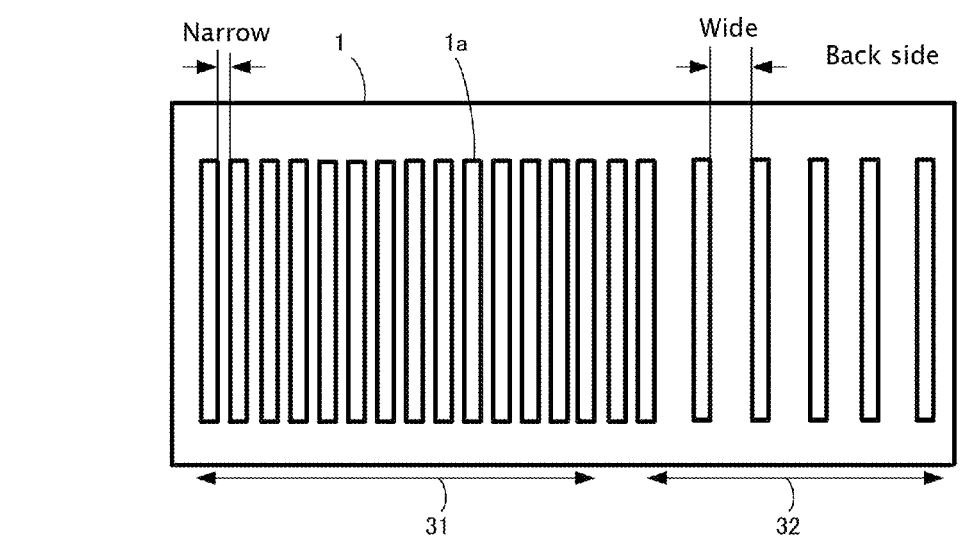
FIG. 1(b) is the bottom plan view of the semiconductor apparatus according to the first embodiment.
Figure 2A:
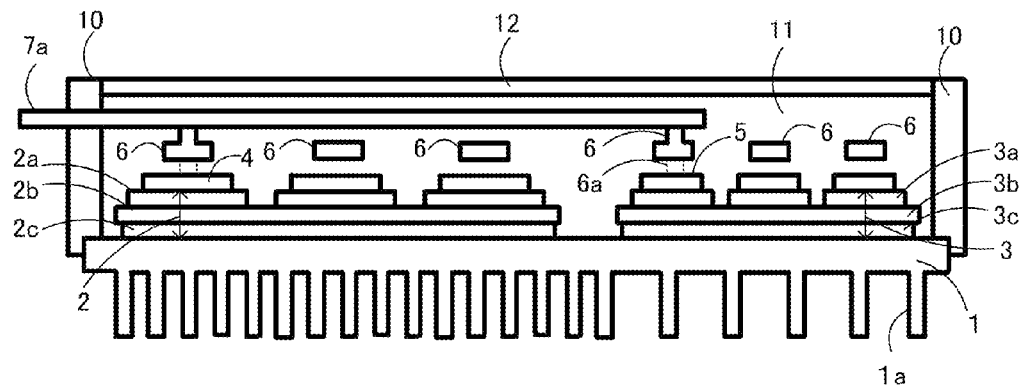
FIG. 2(a) is the cross sectional view along the single-dotted chain line X-X in FIG. 1(a).
Figure 2B:
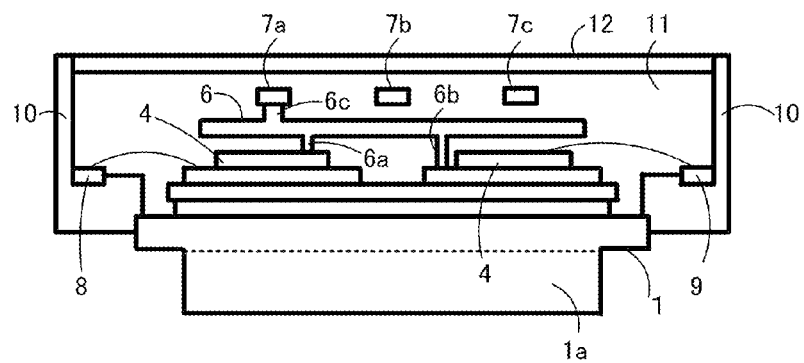
FIG. 2(b) is the cross sectional view along the line segment Y1-Y1 in FIG. 1(a).
Figure 2C:
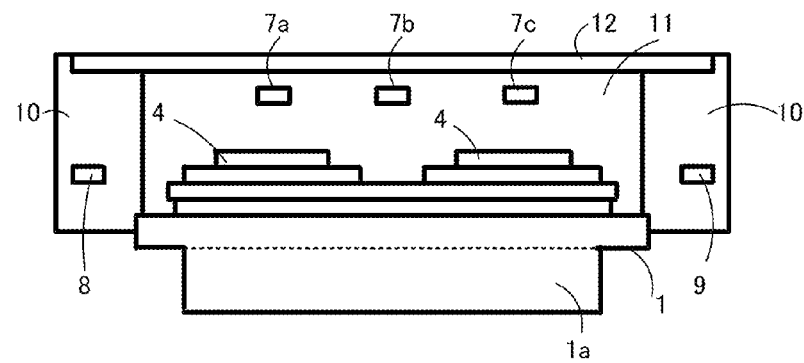
FIG. 2(c) is the cross sectional view along the line segment Y2-Y2 in FIG. 1(a).
Figure 3A:
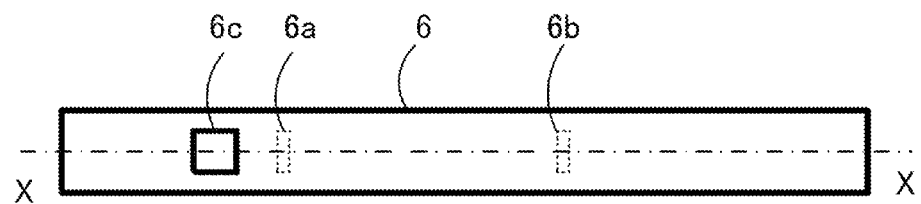
FIG. 3(a) is the top plan view of a U-phase terminal in FIG. 1(a).
Figure 3B:
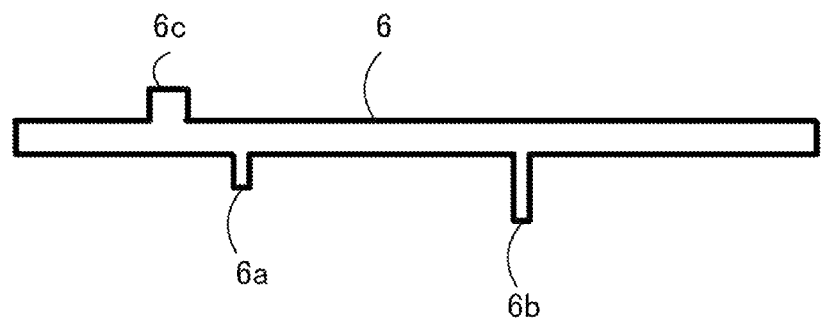
FIG. 3(b) is the cross sectional view along the single-dotted chain line X-X in FIG. 3(a).

FIG. 1(a) is the top plan view of a semiconductor apparatus according to a first embodiment of the invention. FIG. 1(b) is the bottom plan view of the semiconductor apparatus according to the first embodiment. FIG. 2(a) is the cross sectional view along the single-dotted chain line X-X in FIG. 1(a). FIG. 2(b) is the cross sectional view along the line segment Y1-Y1 in FIG. 1(a). FIG. 2(c) is the cross sectional view along the line segment Y2-Y2 in FIG. 1(a). FIG. 3(a) is the top plan view of a U-phase terminal in FIG. 1(a). FIG. 3(b) is the cross sectional view along the single-dotted chain line X-X in FIG. 3(a).

In FIG. 1(a), cover 12 is taken off. Semiconductor apparatus 100 in FIG. 1(a) is a power semiconductor module constituting a three-phase inverter circuit thereon.

Semiconductor apparatus 100 includes base 1 including fins 1a formed thereon. According to the first embodiment, fin 1a is a plate-shaped tooth (rectangular parallelepiped). Base 1 includes first section 31, in which the space between fins 1a is narrow (fins 1a are arranged densely), and second section 32, in which the space between fins 1a is wide (fins 1a are arranged not so densely). First insulated substrate 2 is fixed to first section 31 with a solder. Second insulated substrate 3 is fixed to second section 32 with a solder.

First insulated substrate 2 is a direct-copper-bonding substrate (hereinafter referred to a "DCB substrate") including first insulator substrate 2b made of a ceramics and such a stuff exhibiting a high thermal conductivity and a high electrical insulation, first electrically conductive film 2c formed on the back surface of first insulator substrate 2b, and first electrically conductive pattern 2a formed on the front surface of first insulator substrate 2b. Second insulated substrate 3 is a DCB substrate including second insulator substrate 3b made of a ceramics and such a stuff exhibiting a high thermal conductivity and a high electrical insulation, second electrically conductive film 3c formed on the back surface of second insulator substrate 3b, and second electrically conductive pattern 3a formed on the front surface of second insulator substrate 3b.

Three first electrically conductive patterns 2a are aligned on an upper line for constituting an upper arm and remaining three first electrically conductive patterns 2a are aligned on a lower line for constituting a lower arm. The collector of Si-IGBT chip 4 is fixed to each first electrically conductive pattern 2a with a solder. Three second electrically conductive patterns 3a are aligned on an upper line for constituting the upper arm and remaining three second electrically conductive patterns 3a are aligned on a lower line for constituting the lower arm. The cathode of SiC-Di chip 5 is fixed to each second electrically conductive pattern 3a with a solder.

Three first electrically conductive patterns 2a on the upper line and three second electrically conductive patterns 3a on the upper line are connected to P-terminal bar 8 with wires 34 (by ultrasonic bonding). The emitters of three Si-IGBT chips 4 on the lower line and the anodes of three SiC-Di chips 5 on the lower line are connected to N-terminal bar 9 with wires 35 (by ultrasonic bonding).

The emitter of Si-IGBT chips 4 for the U-phase (V-phase or W-phase) on the upper line and first electrically conductive pattern 2a for the U-phase (V-phase or W-phase) on the lower line are fixed with a solder to projections 6a and 6b, respectively, formed on the under surface of first (second or third) connection bar 6 from the left-hand side. The anode of SiC-Di chips 5 for the U-phase (V-phase or W-phase) on the upper line and second electrically conductive pattern 3a for the U-phase (V-phase or W-phase) on the lower line are fixed with a solder to projections 6a and 6b, respectively, formed on the under surface of fourth (fifth or sixth) connection bar 6 from the left-hand side. The solder is a high temperature solder, the melting point thereof is 300° C. or higher.

Among six connection bars 6, first and fourth connection bars 6 from the left-hand side are fixed to U-terminal bar 7a via projections 6c formed on first and fourth connection bars 6 by laser welding. Second and fifth connection bars 6 from the left-hand side are fixed to V-terminal bar 7b via projections 6c formed on second and fifth connection bars 6 by laser welding. Third and sixth connection bars 6 from the left-hand side are fixed to W-terminal bar 7c via projections 6c formed on third and sixth connection bars 6 by laser welding.

The constituent elements described above are surrounded by resin case 10. Gel 11 is poured into resin case 10. Resin case 10 filled with gel 11 poured therein is covered with cover 12.

Si-IGBT chips 4 arranged in first section 31, in which fins 1a are arranged densely (the space between fins 1a is narrow), are made to operate at the operable temperature thereof, that is 175° C. SiC-Di chips 5 arranged in second section 32, in which fins 1a are arranged not so densely (the space between fins 1a is wide), are made to operate at the operable temperature thereof, that is 250° C.

By disposing first section 31, in which fins 1a are arranged densely (the space between fins 1a is narrow), and second section 32, in which fins 1a are arranged not so densely (the space between fins 1a is wide), chips 4 and 5 are made to operate at the respective operable temperatures.

Figure 4A:
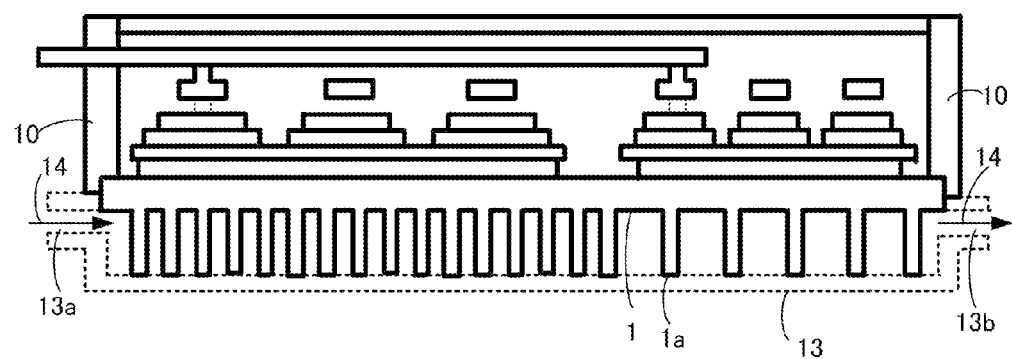
FIG. 4(a) is the cross sectional view of the semiconductor apparatus according to the first embodiment describing the cooling method thereof.
Figure 4B:
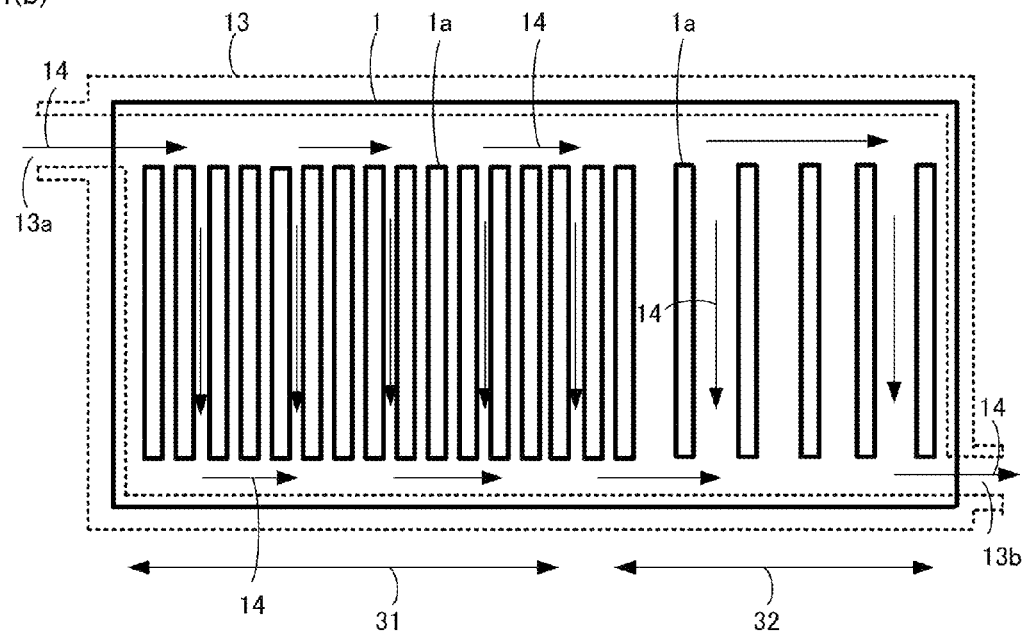
FIG. 4(b) is the bottom plan view of the semiconductor apparatus according to the first embodiment describing the cooling method thereof.

FIG. 4(a) is the cross sectional view of semiconductor apparatus 100 according to the first embodiment describing the way of cooling semiconductor apparatus 100. FIG. 4(b) is the bottom plan view describing the way of cooling semiconductor apparatus 100.

Cover 13, which is a water jacket, is set on base 1 including fins formed thereon. Cover 13 includes inlet 13a and outlet 13b for coolant 14 (e.g. water). Coolant 14 enters cover 13 from inlet 13a and passes through the spaces between fins 1a toward outlet 13b. The disposition of section 32, in which the space between fins 1a is wide, facilitates reducing the pressure loss of coolant 14. By reducing the pressure loss, the size of the not shown pump for circulating coolant 14 is reduced and the manufacturing costs of the entire inverter system are reduced. Cover 13 may be fixed to base 1 and formed into a unit with base 1 in advance in the stage of fixing first insulated substrate 2 onto base 1.

Figure 5A:
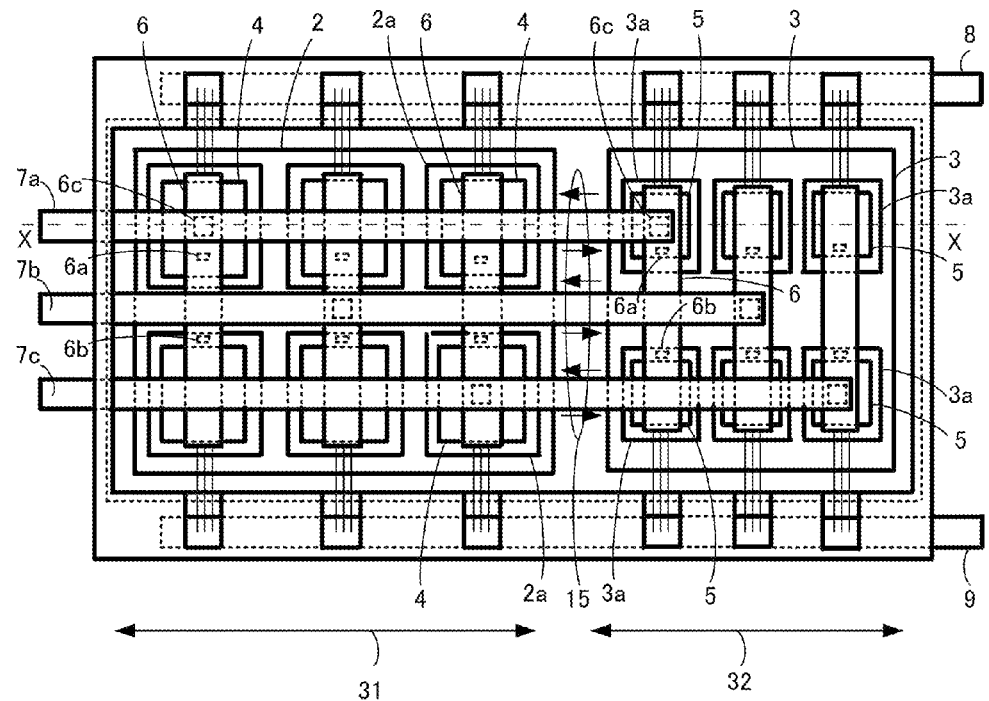
FIG. 5(a) is the top plan view of the semiconductor apparatus according to the first embodiment describing the heat generated from the chips.
Figure 5B:
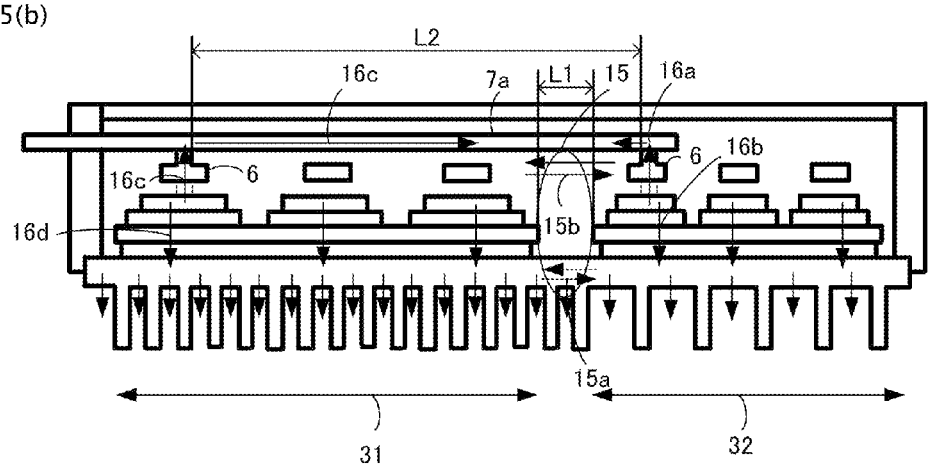
FIG. 5(b) is the cross sectional view along the single-dotted chain line X-X in FIG. 5(a) describing the heat generated from the chips.

FIG. 5(a) is the top plan view of semiconductor apparatus 100 according to the first embodiment describing the heat generated from the chips. FIG. 5(b) is the cross sectional view along the single-dotted chain line X-X in FIG. 5(a) describing the heat generated from the chips.

By arranging first insulated substrate 2 and second insulated substrate 3 with the spacing L1 left therebetween, thermal interference 15 between Si-IGBT chip 4 and SiC-Di chip 5 is reduced. The spacing L1 around several mm is effective. Thermal interference 15 includes thermal interference 15a occurred via base 1, and thermal interference 15b occurred via U-terminal bar 7a, V-terminal bar 7b, and W-terminal bar 7c. Thermal interference 15b is larger than thermal interference 15a. If the spacing L1 is several mm, the heat, which reaches base 1, will be dissipated almost to coolant 14 via fins 1a.

Thermal interference 15b is larger than thermal interference 15a. However, if the distance L2 between the connection point of Si-IGBT chip 4 and a terminal bar and the connection point of SiC-Di chip 5 and the terminal bar is set to be several cm, thermal interference 15b will be reduced more greatly than by the conventional structure, in which the corresponding distance is several mm. In other words, Si-IGBT chips 4 and SiC-Di chips 5 are arranged collectively to form the respective groups and the IGBT group center and the FWD group center are spaced apart from each other for several cm. Therefore, the thermal interference via the terminal bars is reduced by the structure according to the first embodiment more effectively than by the conventional structure. As a result, the operating temperature of Si-IGBT chips 4 will be suppressed to be 175° C. or lower, even if SiC-Di chips 5 are operated at 250° C. Therefore, Si-IGBT chips 4 are operated safely.

Since thermal interference 15 (interference 15b mainly) is reduced, it is possible to widen the space between fins 1a under SiC-Di chips 5 more widely than that in the conventional structure. Therefore, the pressure loss of coolant 14 is reduced.

The inverter circuit may be configured using Si-MOSFET's instead of Si-IGBT chips 4. Although the semiconductor apparatus according to the first embodiment is described in connection with a three-phase inverter circuit, the semiconductor apparatus according to the first embodiment may constitute an electric circuit such as a single-phase inverter circuit and a chopper circuit.

The semiconductor apparatus according to the first embodiment arranges Si-IGBT chips 4 collectively and SiC-Di chips collectively, changes the spacing between fins 1a under Si-IGBT chips 4 and the spacing between fins 1a under SiC-Di chips 5 from each other, and makes Si-IGBT chips 4 operate at 175° C. or lower and SiC-Di chips 5 at 250° C. or lower. Therefore, Si-IGBT chip 4 and SiC-Di chip 5 improve the performances thereof to the respective maximums.

By widening the space between fins 1a under SiC-Di chips 5, the pressure loss of coolant 14 is reduced. As a result, the cooling pump (or the cooling fan) is simplified and the manufacturing costs of the entire inverter system are reduced.

Figure 15:
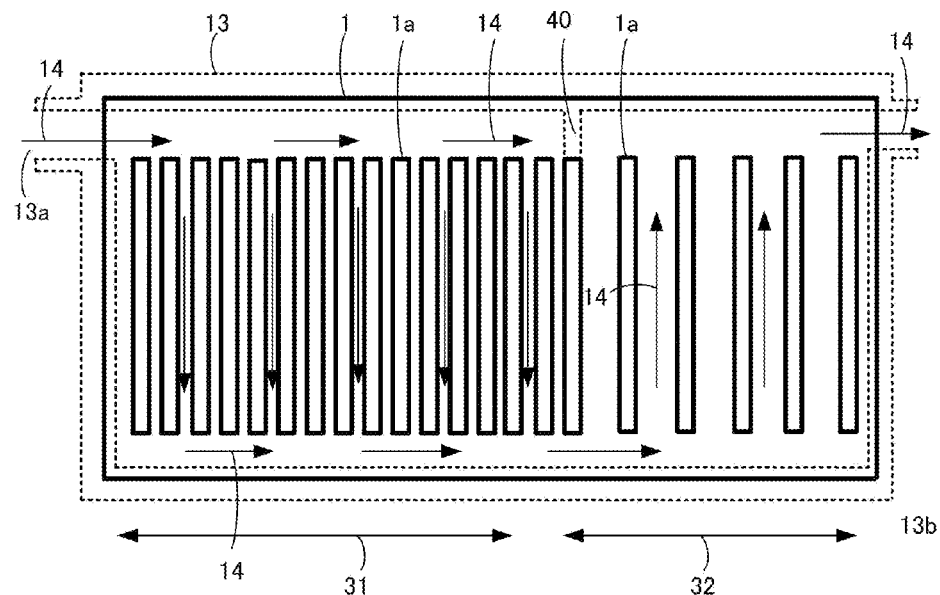
FIG. 15(a) is the bottom plan view of a modified base modified from the base described in FIG. 1(b) and including a partition disposed in the coolant path.
FIG. 15(b) is the bottom plan view of a further modified base modified from the base described in FIG. 15(a) and including partitions disposed in the coolant path.
Figure 15:
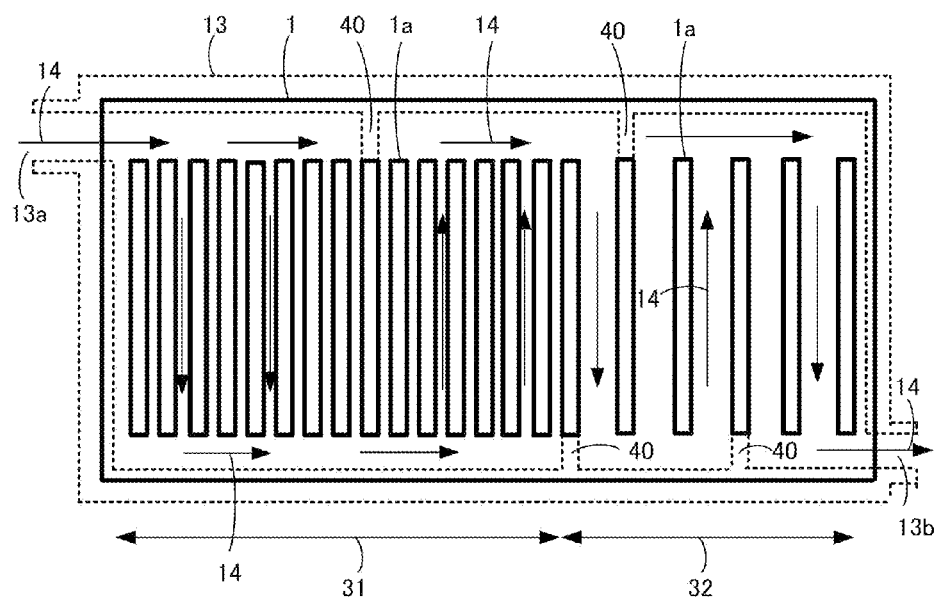

FIG. 15(a) is the bottom plan view of modified base 1 modified from bases 1 described in FIGS. 1(b) and 4(b) and including a partition disposed in the coolant path. FIG. 15(b) is the bottom plan view of further modified base 1 modified from base 1 described in FIG. 15(a) and including partitions disposed in the coolant path.

Base 1 shown in FIG. 15(a) is different from bases 1 shown in FIGS. 1(b) and 4(b) in that cover 13 in FIG. 15(a) includes partition 40 extended from the inner wall thereof on the inlet 13a side and contacting with the most downstream side one of fins 1a arranged densely. Partition 40 changes the flow direction of coolant 14 which has flowed in from inlet 13a. Since coolant 14 flows uniformly through fins 1a disposed densely and meanders in cover 13, the cooling efficiency is improved preferably as compared with the structure shown in FIG. 4(b) which includes no partition.

In FIG. 15(b), partitions 40 are extended from the parallel inner walls of cover 13 alternately such that some partitions 40 are in contact with some fins 1a disposed densely and other partitions 40 are in contact with fins 1a, the space therebetween is wide. Since coolant 14 changes the flow direction thereof frequently, the cooling efficiency under Si-IGTB chips 4 is improved. Two partitions 40 in contact fins 1a disposed densely and two partitions 40 in contact with fins 1a, the space therebetween is wide, are shown in FIG. 15(b). Since an even number of partitions 40 is formed in FIG. 15(b), inlet 13a and outlet 13b are formed on the diagonal line of cover 13. When an odd number of partitions 40 is formed, inlet 13a and outlet 13b may be formed in close proximity to one of the cover 13 sides.

Figure 16:
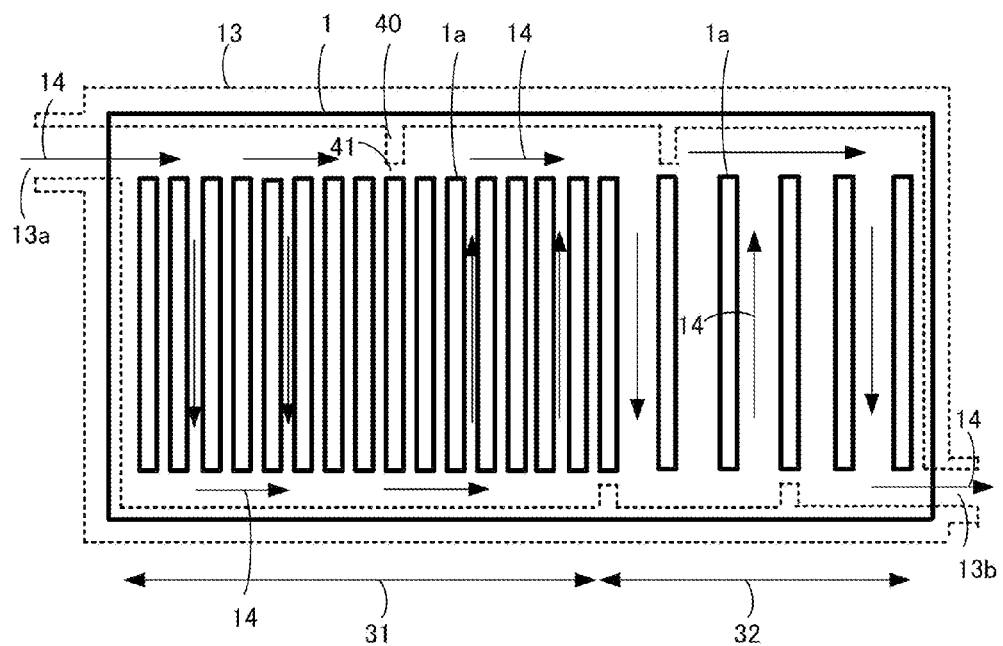
FIG. 16 is the bottom plan view of a modified base modified from the base described in FIG. 15(b) and including partitions disposed in the coolant path and spaced apart from the respective nearest fins.

FIG. 16 is the bottom plan view of modified base 1 modified from base 1 described in FIG. 15(b) and including partitions disposed in the coolant path and spaced apart from the respective nearest fins.

In FIG. 16, partition 40 is not in contact with any fin 1a. Since many partitions 40 are formed in FIG. 15(b), the pressure loss of coolant 14 is large. For reducing the pressure loss of coolant 14, space 41 is formed between partition 40 and fin 1a and coolant 14 is made to flow also through space 41. Space 41 may be adjusted appropriately. Space 41 between partition 40 and fin 1a disposed densely and space 41 between partition 40 and fin 1a disposed not so densely may be made to differ from each other so that the pressure loss of coolant 14 and the flow rate of coolant 14 between fins 1a may be adjusted simultaneously.

FIG. 17(a) is the bottom plan view of modified base 1 modified from bases 1 described in FIGS. 1(b) and 4(b). FIG. 17(b) is the cross sectional view along the single-dotted chain line X-X in FIG. 17(a). FIG. 17(c) is the cross sectional view along the single-dotted chain line Y1-Y1 in FIG. 17(a). FIG. 17(d) is the cross sectional view along the single-dotted chain line Y2-Y2 in FIG. 17(a).

In FIG. 17(a), fins 1a, the lengths thereof are different from each other are arranged in the flow direction of coolant 14. In section 31, in which the fins should be arranged densely, long fin 1a and short fin 1a are extended alternately in the flow direction of coolant 14. In section 32, in which the fins should be arranged no so densely, only long fins 1a are extended in the flow direction of coolant 14.

[Second Embodiment]

Figure 6A:
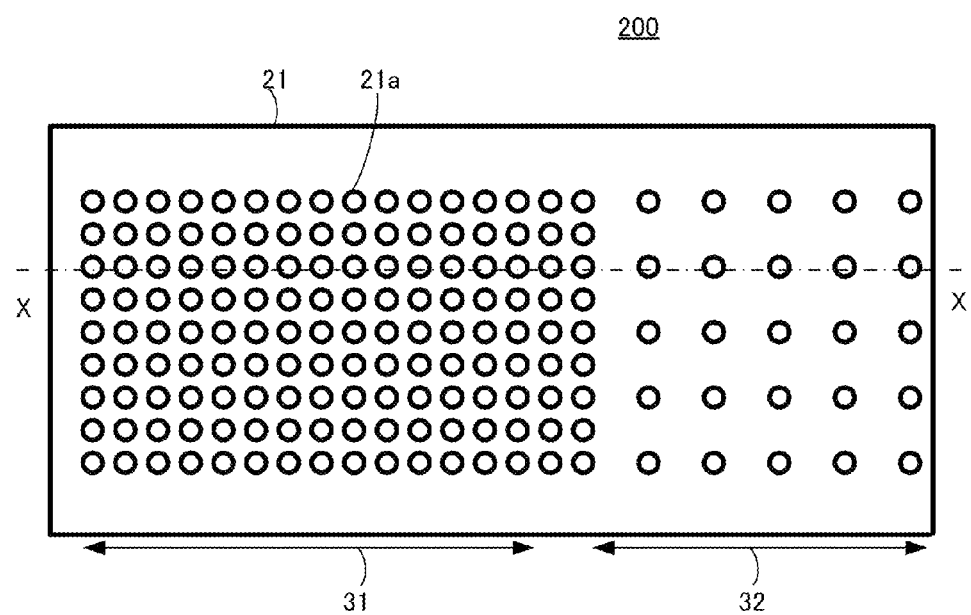
FIG. 6(a) is the bottom plan view of a base including fins formed thereon in a semiconductor apparatus according to a second embodiment of the invention.
Figure 6B:
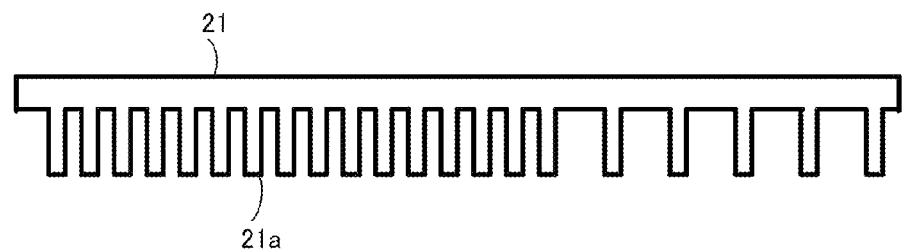
FIG. 6(b) is the cross sectional view along the single-dotted chain line X-X in FIG. 6(a).

FIG. 6(a) is the bottom plan view of base 21 including fins 21a formed thereon in semiconductor apparatus 200 according to a second embodiment of the invention. FIG. 6(b) is the cross sectional view along the single-dotted chain line X-X in FIG. 6(a).

Fin 21a according to the second embodiment is different from fin 1a according to the first embodiment in that fin 21a is shaped with a cylindrical column. By disposing fins 21a densely in section 31 and not so densely in section 32, the effects the same with the effects which the semiconductor apparatus according to the first embodiment exhibits are obtained.

The shape of fin 21a is not always limited to a rectangular parallelepiped nor to a cylindrical column. Fin 21a may be nearly a rectangular parallelepiped, the side wall of which is uneven, or nearly a cylindrical column such as a hexagonal column with no problem. Further, fins 21a may be a triangular column or a quadratic column with no problem.

Figure 18:
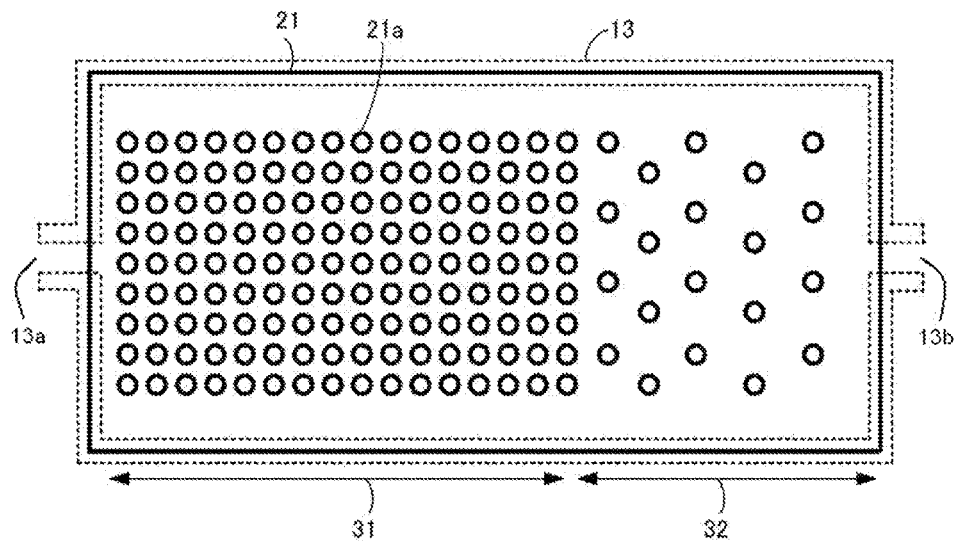
FIG. 18(a) is the bottom plan view of the base describing a modified arrangement of the fins described in FIG. 6(a).
FIG. 18(b) is the bottom plan view of the base describing another modified arrangement of the fins described in FIG. 6(a).
Figure 18:
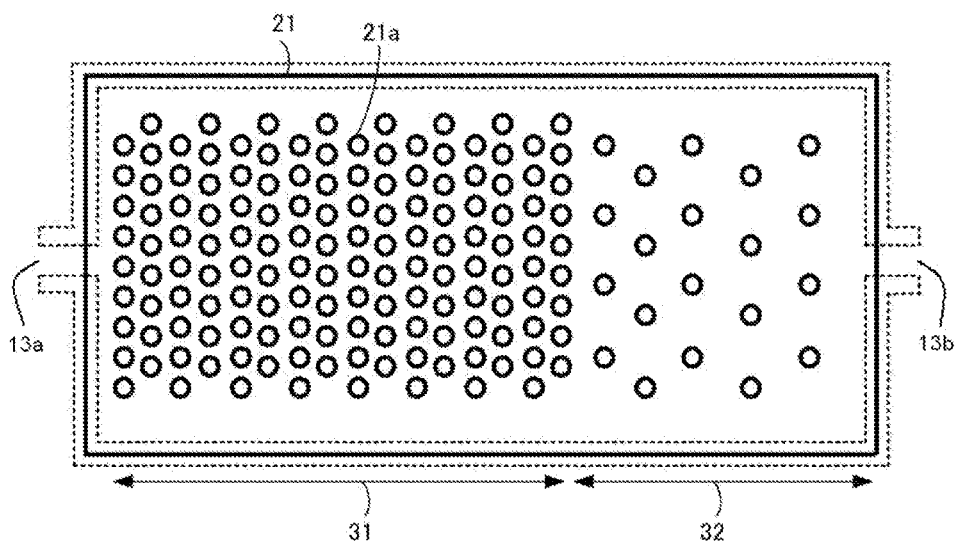

FIG. 18(a) is the bottom plan view of base 21 describing a modified arrangement of fins 21a. FIG. 18(b) is the bottom plan view of base 21 describing another modified arrangement of fins 21a.

In FIG. 18(a), fins 21a disposed not so densely are arranged in a planar triangular pattern. In FIG. 18(b), all fins 21a dispose densely and not so densely are arranged in the respective planar triangular patterns.

In FIGS. 18(a) and 18(b), inlet 13a and outlet 13b are positioned at the respective parallel side centers of cover 13. By arranging fins 21a in a triangular pattern, coolant 14 is made to meander and the cooling efficiency thereof is improved. In the triangular arrangement, the lines connecting the centers of adjacent fins 21 form a triangle. The triangular arrangement is referred to also as the "hexagonal arrangement".

[Third Embodiment]

Figure 7A:
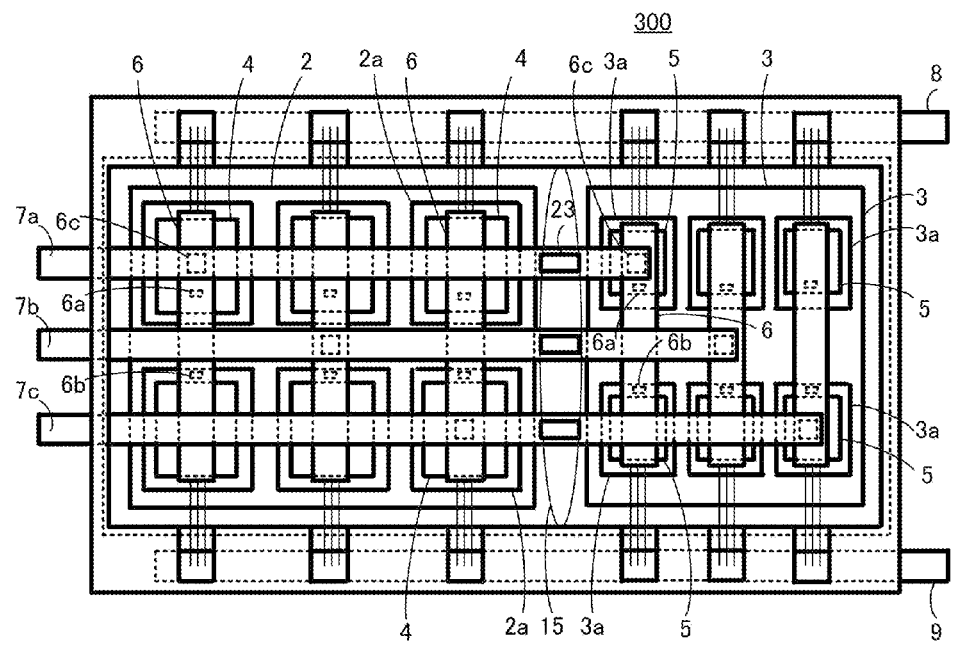
FIG. 7(a) is the top plan view of a semiconductor apparatus according to a third embodiment of the invention.
Figure 7B:
FIG. 7(b) is the top plan view of a U-terminal bar in the semiconductor apparatus according to the third embodiment.
Figure 7C:
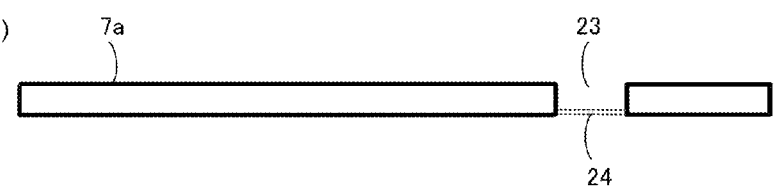
FIG. 7(c) is the cross sectional view of the U-terminal bar along the single-dotted chain line X-X in FIG. 7(b).

FIG. 7(a) is the top plan view of semiconductor apparatus 300 according to a third embodiment of the invention. FIG. 7(b) is the top plan view of U-terminal bar 7a (V-terminal bar 7b or W-terminal bar 7c) in semiconductor apparatus 300 shown in FIG. 7(a). FIG. 7(c) is the cross sectional view of U-terminal bar 7a (V-terminal bar 7b or W-terminal bar 7c) along the single-dotted chain line X-X in FIG. 7(b).

U-terminal bar 7a (V-terminal bar 7b or W-terminal bar 7c) according to the third embodiment is different from U-terminal bar 7a (V-terminal bar 7b or W-terminal bar 7c) according to the first embodiment in that U-terminal bar 7a (V-terminal bar 7b or W-terminal bar 7c) according to the third embodiment includes opening 23 formed therein. In the portion of U-terminal bar 7a (V-terminal bar 7b or W-terminal bar 7c), in which opening 23 is formed, the thermal resistance is high enough to reduce the thermal interference between Si-IGBT chip 4 and SiC-Di chip 5. By reducing the thermal interference, it is possible to widen the space between fins 1a and to reduce the pressure loss.

Alternatively, recess 24, not bored through U-terminal bar 7a (V-terminal bar 7b or W-terminal bar 7c), may be formed instead of opening 23 as shown by the broken lines in FIG. 7(c). Recess 24 is effective to reduce the wiring inductance, which is made to be high by opening 23. Opening 23 and recess 24 work as a section for reducing thermal interference (hereinafter referred to as a "thermal interference reduction section").

By forming a thermal interference reduction section in U-terminal bar 7a (V-terminal bar 7b or W-terminal bar 7c) and base 1 which connect Si-IGBT chip 4 (Si semiconductor device) and SiC-Di chip 5 (SiC semiconductor device) to each other, thermal interference 15 between the Si semiconductor device and the SiC semiconductor device is made to be small. As a result, it is possible to further widen the spaces between all the fins 1a and to further reduce the pressure loss of coolant 14.

[Fourth Embodiment]

Figure 8:
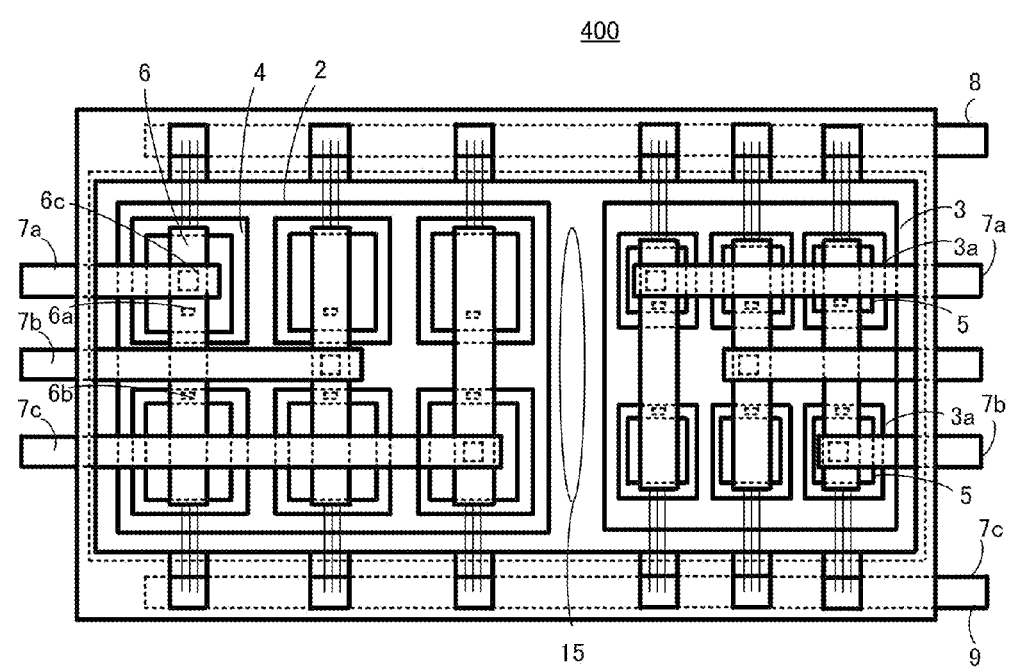
FIG. 8 is the top plan view of a semiconductor apparatus according to a fourth embodiment of the invention.

FIG. 8 is the top plan view of a semiconductor apparatus according to a fourth embodiment of the invention.

Semiconductor apparatus 400 according to the fourth embodiment is different from semiconductor apparatus 100 according to the first embodiment in that U-terminal bars 7a (V-terminal bars 7b or W-terminal bars 7c) are led out to the Si-IGBT chip 4 side and the SiC-Di chip 5 side respectively such that U-terminal bars 7a (V-terminal bars 7b or W-terminal bars 7c) are not connected to each other. By separating U-terminal bar 7a on the Si-IGBT chip 4 side (V-terminal bar 7b on the Si-IGBT chip 4 side or W-terminal bar 7c on the Si-IGBT chip 4 side) and U-terminal bar 7a on the SiC-Di chip 5 side (V-terminal bar 7b on the SiC-Di chip 5 side or W-terminal bar 7c on the SiC-Di chip 5 side) from each other, thermal interference 15 occurred via the terminal bar between Si-IGBT chip 4 and SiC-Di chip 5 is interrupted. By virtue of the interruption of thermal interference 15, the space between fins 1a is widened and the pressure loss of coolant 14 is reduced.

U-terminal bars 7a on both sides, V-terminal bars 7b on both sides, and W-terminal bars 7c on both sides are connected to each other by the respective external wirings not shown but arranged outside semiconductor apparatus 400.

[Fifth Embodiment]

Figure 9:
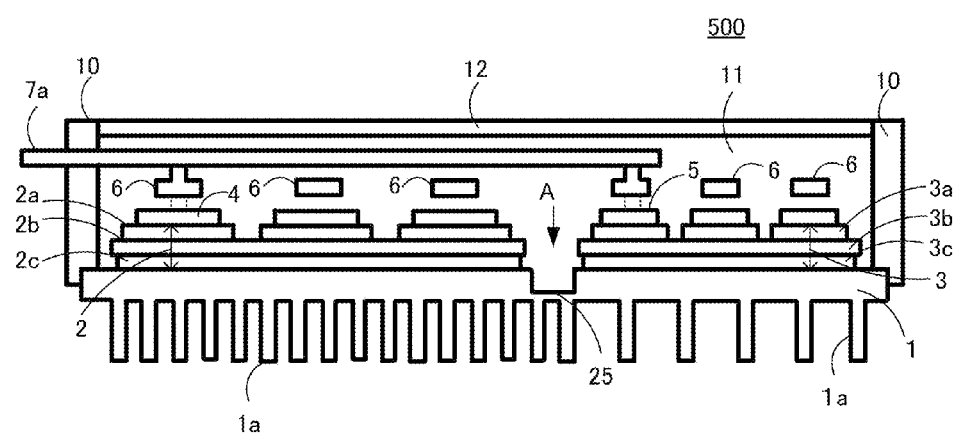
FIG. 9(a) is the cross sectional view of a semiconductor apparatus according to a fifth embodiment of the invention.
FIG. 9(b) is the top plan view of a base including fins formed thereon seen in the direction A in FIG. 9(a).
Figure 9:
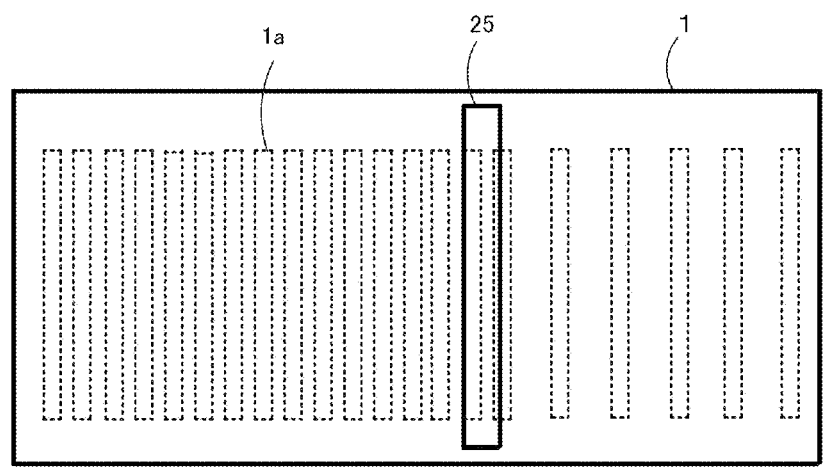
Figure 10:
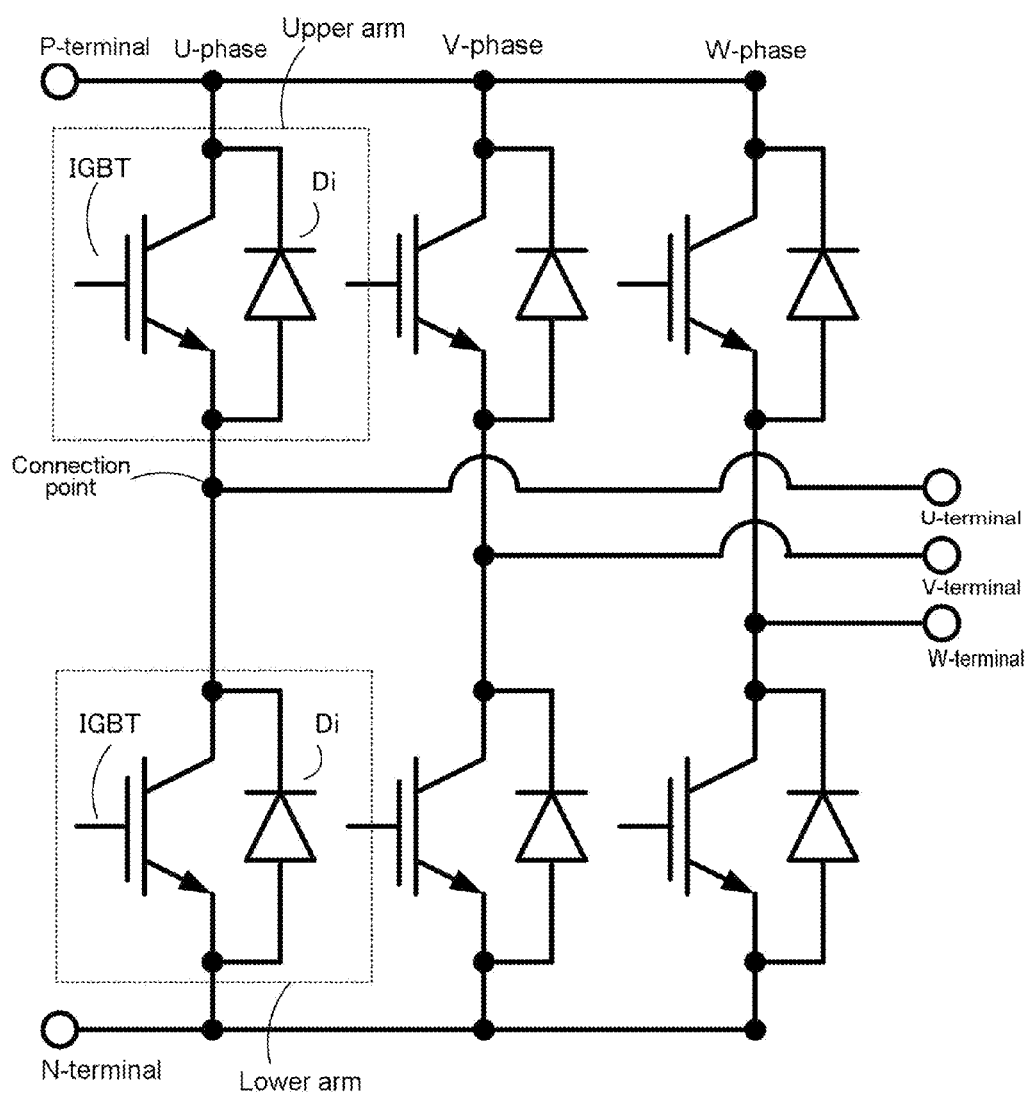
FIG. 10 is the circuit diagram of a three-phase inverter.
Figure 11:
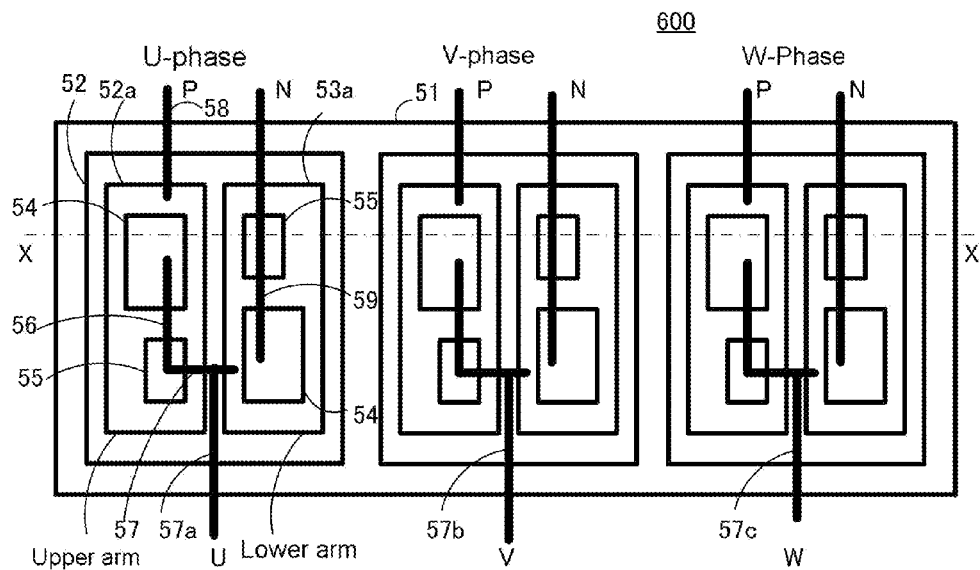
FIG. 11(a) is the top plan view of a conventional semiconductor apparatus.
FIG. 11(b) is the cross sectional view along the single-dotted chain line X-X in FIG. 11(a).
FIG. 11(c) is the bottom plan view of the conventional semiconductor apparatus showing the base including fins formed thereon.
Figure 11:
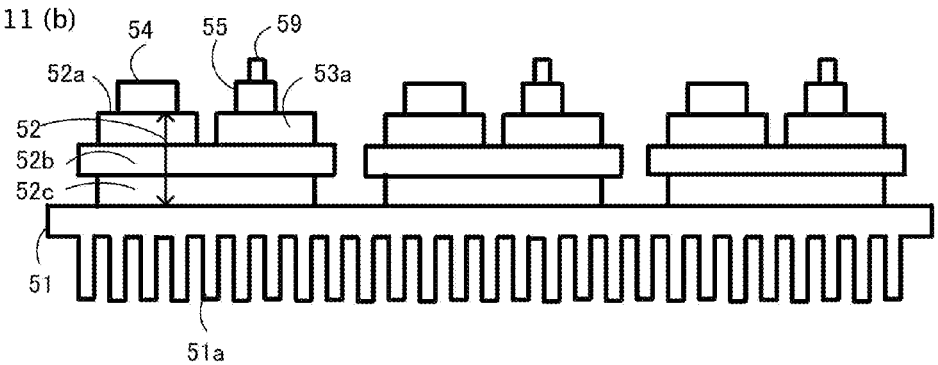
Figure 11:
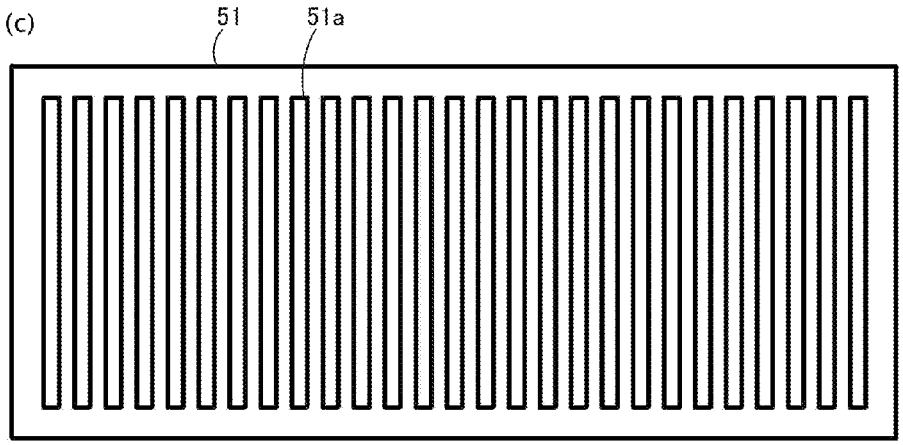
Figure 12:
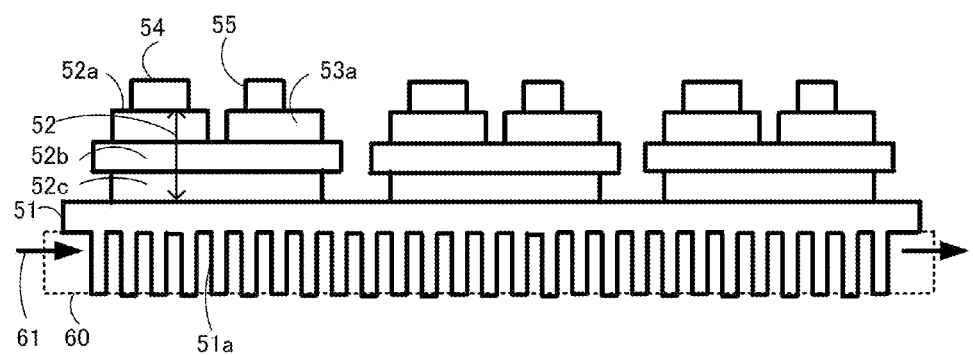
FIG. 12(a) is a cross sectional view describing the way of cooling the conventional semiconductor apparatus.
FIG. 12(b) is a bottom view describing the way of cooling the conventional semiconductor apparatus.
Figure 12:
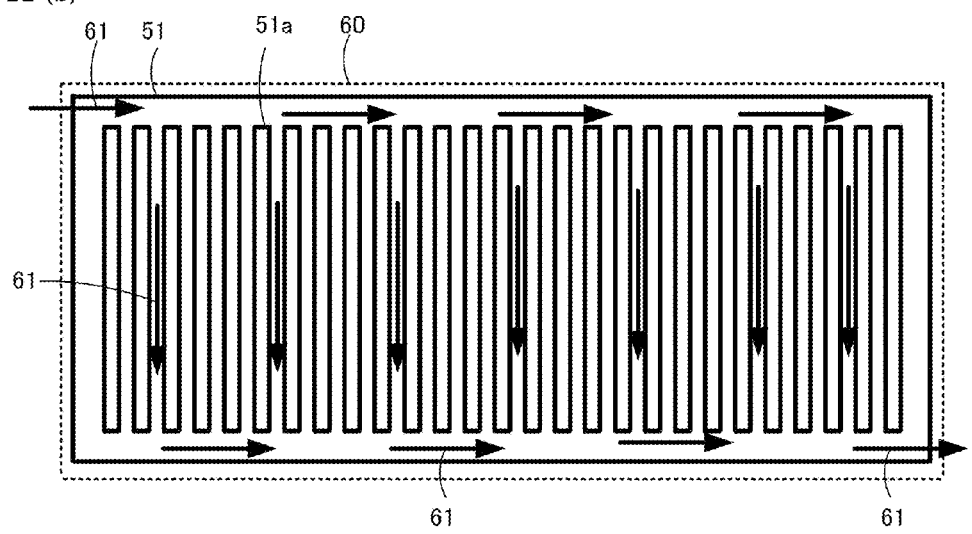
Figure 13:
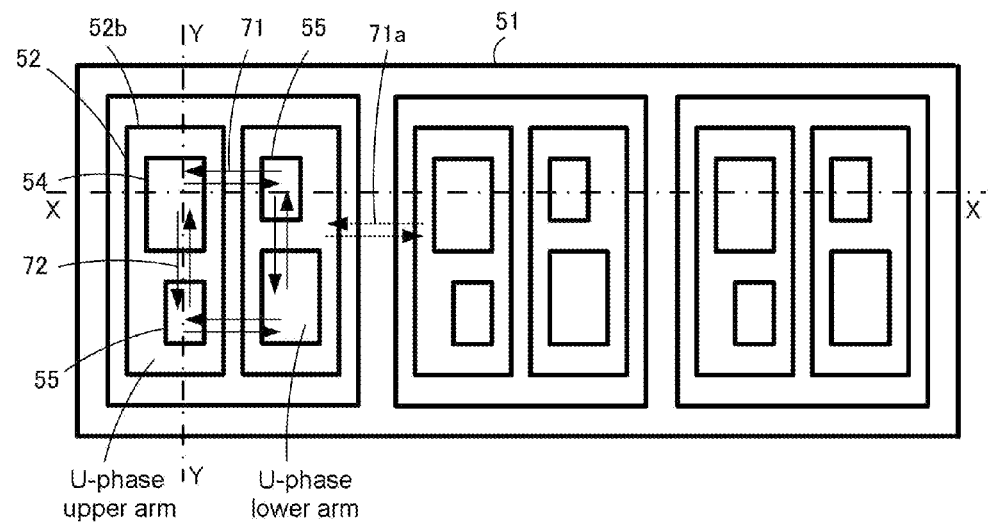
FIG. 13(a) is the top plan view describing the thermal interference occurred between the chips in the conventional semiconductor apparatus.
FIG. 13(b) is the cross sectional view along the single-dotted chain line X-X in FIG. 13(a) describing the thermal interference occurred between the chips in the conventional semiconductor apparatus.
FIG. 13(c) is the cross sectional view along the single-dotted chain line Y-Y in FIG. 13(a) describing the thermal interference occurred between the chips in the conventional semiconductor apparatus.
Figure 13:
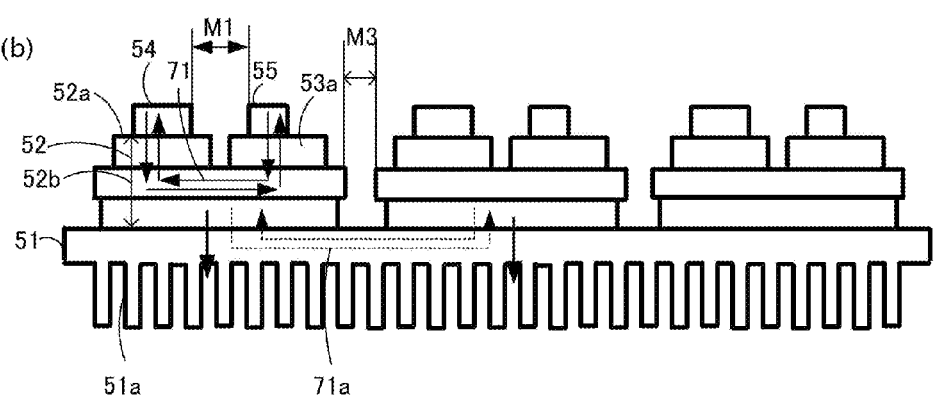
Figure 13:
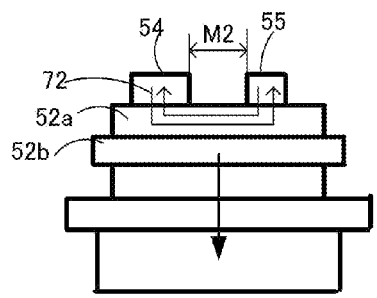
Figure 14:
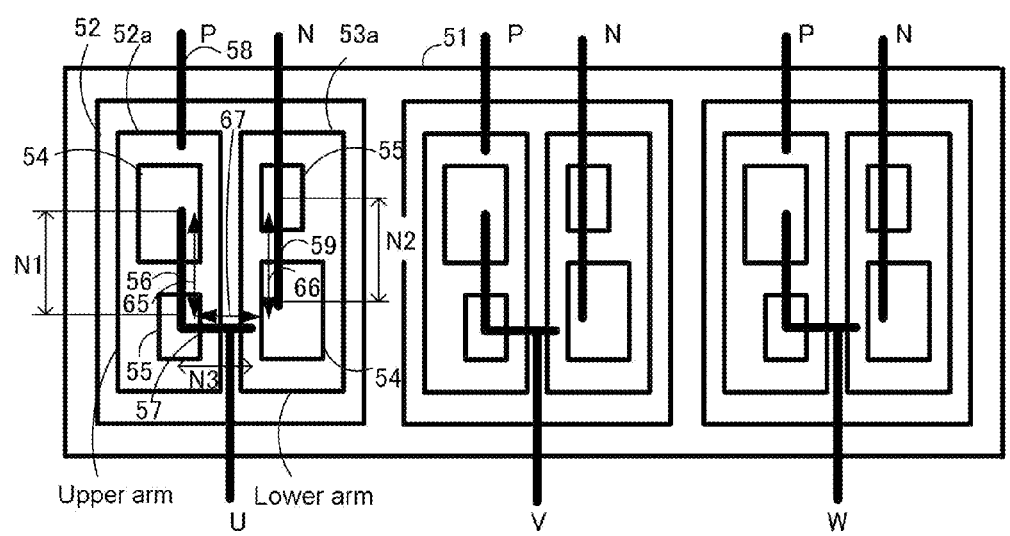
FIG. 14 is a top plan view describing the heat exchanges between the chips via terminal bars in the conventional semiconductor apparatus.

FIG. 9(a) is the cross sectional view of semiconductor apparatus 500 according to a fifth embodiment of the invention. FIG. 9(b) is the top plan view of a base including fins formed thereon seen in the direction A in FIG. 9(a).

Semiconductor apparatus 500 according to the fifth embodiment is different from semiconductor apparatus 100 shown in FIG. 1(b) in that cutout 25 is formed in the portion of base 1, through which thermal interference 15a occurs, to reduce thermal interference 15a. Instead of forming cutout 25, base 1 is divided into two in the portion thereof, in which thermal interference 15a occurs, and a thermal insulator stuff is inserted between divided bases 1 (that is between sections 31 and 32, shown e.g. in FIGS. 5(a) and 5(b)). It is preferable for the thermal insulator stuff to be resistive against a temperature of 300° C. or higher and to be in excellent contact with copper or aluminum, of which base 1 is made.

By combining the structures according to the first through fifth embodiments appropriately, semiconductor apparatuses, which facilitate suppressing the thermal interference and reducing the pressure loss of coolant, are obtained.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments can be combined, as would be understood by one of skill in the art.

This application is based on, and claims priority to, Japanese Patent Application No. 2010-165759, filed on Jul. 23, 2010, and Japanese Patent Application No. 2011-053332, filed on Mar. 10, 2011. The disclosures of the priority applications, in their entirety, including the drawings, claims, and the specifications thereof, are incorporated herein by reference.

What is claimed is:

1. A semiconductor apparatus comprising;
a first semiconductor device made of silicon, the first semiconductor devices being arranged collectively, whereby to form a first device group;

a second semiconductor device made of silicon carbide, the second semiconductor devices being arranged collectively, whereby to form a second device group;

a wiring conductor connecting the first semiconductor device and the second semiconductor device; and a cooling fin base comprising a plurality of projections formed thereon, whereby to dissipate heat generated from the first and second semiconductor devices; wherein, the projections arranged under the second device group are spaced apart from each other more widely than the projections arranged under the first device group.

2. The semiconductor apparatus according to claim 1, wherein the first semiconductor device comprises a MOS type transistor, and the second semiconductor device comprises a Schottky barrier diode.

3. The semiconductor apparatus according to claim 1, wherein the first semiconductor device and the second semiconductor device constitute an electric circuit.

4. The semiconductor apparatus according to claim 1, wherein the projections comprise nearly a rectangular parallelepiped or a cylindrical column.

5. The semiconductor apparatus according to claim 1, wherein the wiring conductor comprises a first thermal interference reduction section between connection points of the wiring conductor and the first and second semiconductor devices.

6. The semiconductor apparatus according to claim 5, wherein the first thermal interference reduction section comprises an opening or a recess.

7. The semiconductor apparatus according to claim 1, wherein the wiring conductor is cut into two between connection points of the wiring conductor and the first and second semiconductor devices.

8. The semiconductor apparatus according to claim 1, wherein the cooling fin base comprises a first thermal interference reduction section formed therein between the first and second device groups.

9. The semiconductor apparatus according to claim 8, wherein the first thermal interference reduction section comprises a cutout or a thermal insulator stuff inserted into a portion of the cooling fin base between the first and second devices groups.

10. The semiconductor apparatus according to claim 1, the semiconductor apparatus further comprising:

a cover covering the cooling fin base, whereby to make a coolant flow between an inner wall of the cover and the projections and between the projections and whereby to dissipate heat from the cooling fin base to the coolant; and the cover comprising a partition, whereby to make the coolant meander.

11. The semiconductor apparatus according to claim 1, the semiconductor apparatus further comprising:

a cover covering the cooling fin base, whereby to make a coolant flow between an inner wall of the cover and the projections and between the projections and whereby to dissipate heat from the cooling fin base to the coolant; and the projections comprising a long projection and a short projection, the long and short projections being extended in parallel to a flow direction of the coolant.

12. The semiconductor apparatus according to claim 4, wherein the projections are arranged in a two-dimensional triangular pattern.

* * * * *